(12) United States Patent
Mittal et al.

(10) Patent No.: US 11,145,726 B2
(45) Date of Patent: Oct. 12, 2021

(54) DOPED THROUGH-CONTACT STRUCTURES

(71) Applicant: Applied Materials, Inc., Santa Clara, CA (US)

(72) Inventors: Sushant Mittal, Bengaluru (IN); Ashish Pal, Hayward, CA (US); El Mehdi Bazizi, San Jose, CA (US); Angada Sachid, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/654,904

(22) Filed: Oct. 16, 2019

(65) Prior Publication Data

US 2021/0119002 A1  Apr. 22, 2021

(51) Int. Cl.
*H01L 29/417* (2006.01)
*H01L 29/66* (2006.01)
*H01L 29/78* (2006.01)

(52) U.S. Cl.
CPC .... *H01L 29/4175* (2013.01); *H01L 29/41791* (2013.01); *H01L 29/66795* (2013.01); *H01L 29/7856* (2013.01)

(58) Field of Classification Search
CPC ....... H01L 29/66; H01L 29/78; H01L 29/417; H01L 29/4175; H01L 29/41791; H01L 29/7856; H01L 29/66795; H01L 29/785; H01L 29/7853; H01L 27/0886; H01L 27/0924; H01L 27/10826; H01L 27/10879; H01L 27/1211; H01L 21/845;
(Continued)

(56) References Cited

U.S. PATENT DOCUMENTS 9,773,913 B1  9/2017  Balakrishnan et al.
10,374,040 B1  8/2019  Chanemougame et al.
(Continued)

FOREIGN PATENT DOCUMENTS

KR  2016-0144542 A  12/2016

OTHER PUBLICATIONS

Xie, R., et al., "A 7nm FinFET technology featuring EUV patterning and dual strained high mobility channels", Conference: 2016 IEEE International Electron Devices Meeting (IEDM), Dec. 1, 2016, DOI: 10.1109/IEDM.2016.7838334, 4 pages.
(Continued)

*Primary Examiner* — Chuong A Luu
(74) *Attorney, Agent, or Firm* — Kilpatrick Townsend & Stockton LLP (57) ABSTRACT

Semiconductor structures may include a substrate. The structures may include a gate structure overlying the substrate and formed in a first direction across the substrate. The structures may include a fin overlying the substrate and formed in a second direction across the substrate. The second direction may be orthogonal to the first direction, and the fin may intersect the gate structure. The structures may include a source/drain material formed about the fin. The structures may include a through-contact material extending vertically above the source/drain material. The structures may include a metal material extending vertically above the through-contact material. An interface between the metal material and the through-contact material may be characterized by a non-planar profile.

20 Claims, 5 Drawing Sheets

(58) Field of Classification Search
CPC ..... H01L 21/823431; H01L 21/823437; H01L 29/665; H01L 29/66507; H01L 29/7845; H01L 29/7855; H01L 29/7858; H01L 21/823418; H01L 21/823814
USPC .......................................................... 257/365
See application file for complete search history.

(56) References Cited

U.S. PATENT DOCUMENTS

| | | | |
|---|---|---|---|
| 2006/0197154 A1* | 9/2006 | Pelella | H01L 21/84 257/347 |
| 2010/0171173 A1 | 7/2010 | Hsieh | |
| 2013/0295739 A1 | 11/2013 | Hsiao et al. | |
| 2018/0358436 A1* | 12/2018 | Jambunathan | H01L 29/0847 |
| 2020/0105880 A1* | 4/2020 | Dasgupta | H01L 29/778 |

OTHER PUBLICATIONS

Ni, C.-N., et al., "Ultra-low contact resistivity with highly doped Si:P contact for nMOSFET", Conference: 2015 Symposium on VLSI Technology, Jun. 1, 2015, DOI:10.1109/VLSIT.2015. 7223711, 2 pages.

"Metal/Semiconductor Ohmic Contacts", Index of /class/ee311/ NOTES, Apr. 13, 2004, retrieved from web.standford.edu, 22 pages.

Peng, P.W., et al., "Elimination of Tungsten-voids in middle-of-line contacts for advanced planar CMOS and FinFET technology", 2016 China Semiconductor Technology International Conference (CSTIC), 2016, DOI:10.1109/CSTIC.2016.7464004, 4 pages.

Hung, R., et al., "Novel solutions to enable contact resistivity <1E-9 Ω-cm2 for 5nm node and beyond," 2018 International Symposium on VLSI Technology, Systems and Application (VLSI-TSA), Hsinchu, 2018, DOI:10.1109/VLSI-TSA.2018.8403817, 2 pages.

Auth, C., et al., "A 10nm high performance and low-power CMOS technology featuring 3rd generation FinFET transistors, Self-Aligned Quad Patterning, contact over active gate and cobalt local interconnects," 2017 IEEE International Electron Devices Meeting (IEDM), San Francisco, CA, 2017, DOI:10.1109/IEDM.2017. 8268472., pp. 29.1.1-29.1.4.

Mittal, S., et al., "Highly-Doped Through-Contact Silicon Epi Design at 3 nm node," 2019 Device Research Conference (DRC), Ann Arbor, MI, USA, 2019, DOI:10.1109/DRC46940.2019. 9046479, 2 pages.

International Search Report and Written Opinion dated Feb. 3, 2021 in International Patent Application No. PCT/US2020/055561, 8 pages.

* cited by examiner

DOPED THROUGH-CONTACT STRUCTURES

TECHNICAL FIELD

The present technology relates to semiconductor systems, processes, and structures. More specifically, the present technology relates to semiconductor devices and structures having improved electrical properties.

BACKGROUND

Integrated circuits are made possible by processes which produce intricately patterned material layers on substrate surfaces. As structures continue to shrink in size, resistance through structures may increase. Many semiconductor structures include a number of different materials together on a substrate. The properties of the different materials may affect the electrical transmission through the structure.

Thus, there is a need for improved systems and methods that can be used to produce high quality devices and structures. These and other needs are addressed by the present technology.

SUMMARY

Semiconductor structures may include a substrate. The structures may include a gate structure overlying the substrate and formed in a first direction across the substrate. The structures may include a fin overlying the substrate and formed in a second direction across the substrate. The second direction may be orthogonal to the first direction, and the fin may intersect the gate structure. The structures may include a source/drain material formed about the fin. The structures may include a through-contact material extending vertically above the source/drain material. The structures may include a metal material extending vertically above the through-contact material. An interface between the metal material and the through-contact material may be characterized by a non-planar profile.

In some embodiments, the structures may include a silicide material extending between the through-contact material and the metal material. The silicide material may be in contact with the through-contact material. The structures may include a liner material extending between the through-contact material and the metal material. The liner material may be in contact with the metal material. A contact area of a surface of the through-contact material facing the metal material may be characterized by a surface area greater than a corresponding surface area of a planar interface. The through-contact material may be at least partially characterized by a first sloping profile in a direction orthogonal to the fin. The through-contact material may be at least partially characterized by a second sloping profile in a direction parallel to the fin. The through-contact material may conformally extend across the source/drain material along a first surface of the through-contact material. A second surface of the through-contact material opposite the first surface may be characterized by an uneven surface profile. The source/drain material may include a dopant incorporated within silicon, and the dopant may be or include phosphorus or arsenic. The source/drain material may be characterized by a resistance less than or about 50.0 mΩ-cm. The through-contact material may be or include a doped silicon.

Some embodiments of the present technology may encompass semiconductor structures. The structures may include a substrate. The structures may include a gate structure overlying the substrate and formed in a first direction across the substrate. The structures may include a fin overlying the substrate and formed in a second direction across the substrate. The second direction may be orthogonal to the first direction, and the fin may intersect the gate structure. The structures may include a source/drain material formed about the fin. The source/drain material may be characterized by sloped sidewalls extending to a point. The structures may include a metal material extending vertically above the source/drain material. The structures may include a through-contact material extending between the source/drain material and the metal material. An interface between the metal material and the through-contact material may be characterized by a non-planar profile.

In some embodiments the structures may include a silicide material extending between the through-contact material and the metal material. The silicide material may be in contact with the through-contact material. The structures may include a liner material extending between the through-contact material and the metal material. The liner material may be in contact with the metal material. A first surface of the through-contact material may be in contact with the source/drain material, and may extend conformally along the sloped sidewalls. A second surface of the through-contact material opposite the first surface may be at least partially characterized by sloped sidewalls substantially parallel with the sloped sidewalls of the source/drain material. The source/drain material may include a dopant incorporated within silicon, and the dopant may be or include phosphorus or arsenic. The source/drain material may be characterized by a resistance less than or about 50.0 mΩ-cm. The through-contact material may be or include a doped silicon.

Some embodiments of the present technology may encompass semiconductor structures. The structures may include a substrate. The structures may include a gate structure overlying the substrate and formed in a first direction across the substrate. The structures may include a fin overlying the substrate and formed in a second direction across the substrate. The second direction may be orthogonal to the first direction, and the fin may intersect the gate structure. The structures may include a source/drain material formed about the fin. The source/drain material may be characterized by sloped sidewalls extending to a point. The structures may include a metal material extending vertically above the source/drain material. The structures may include a through-contact material extending between the source/drain material and the metal material. A first surface of the through-contact material may extend along the sloped sidewalls of the source/drain material. An interface between the metal material and the through-contact material may be characterized by a non-planar profile. The structures may include a silicide material extending in contact with a second surface of the through-contact material opposite the first surface. The structures may include a liner extending between the silicide material and the metal material. In some embodiments the source/drain material may be characterized by a resistance less than or about 50.0 mΩ-cm.

Such technology may provide numerous benefits over conventional systems and techniques. For example, the structures may be characterized by lower plug resistance, which may improve device performance. Additionally, the structures may facilitate metal fill by reducing aspect ratios of trenches, which may reduce void formation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. As device sizes continue to shrink, resistance between components may increase. For example, in FinFET structures, after a gate formation, a metal contact or plug may be formed to the source/drain material. The source/drain material may include a silicon material, and a contact resistance between the source/drain material and the metal may be orders of magnitude higher than other components. Additionally, the structure formed on the substrate may be characterized by high aspect ratios, and deposition on the source/drain material may be difficult to control. This may lead to void formation, which may further increase resistance through the structure, and cause reliability issues.

Conventional technology has struggled to control contact resistance while attempting to further scale FinFET structures. The present technology overcomes these issues with several adjustments to the material layers formed, as well as adjustments to the shape of the materials. By utilizing non-planar structures in some aspects of formation, surface area of materials may be improved. Additionally, by incorporating additional material layers, aspect ratios may be reduced relative to conventional technologies, which may improve metal fill within the contact structure.

Although the remaining disclosure will routinely identify specific structures incorporating aspects of the disclosed technology, it will be readily understood that the structures and methods are equally applicable to other semiconductor structures and systems. Accordingly, the technology should not be considered to be so limited as for use with the described FinFET contact structures or associated processes alone. For example, the concept is also applicable to devices including nano-sheet FETs, nano-wire FETs, SOI FETs, ETSOI FETs, FDSOI FETs, Ferro-electric FETs, and other transistor and semiconductor structures. The disclosure will discuss one possible system that can be used during aspects of producing structures described throughout the present technology before describing a number of FinFET contact structures and variations according to embodiments of the present technology.

Figure 1:
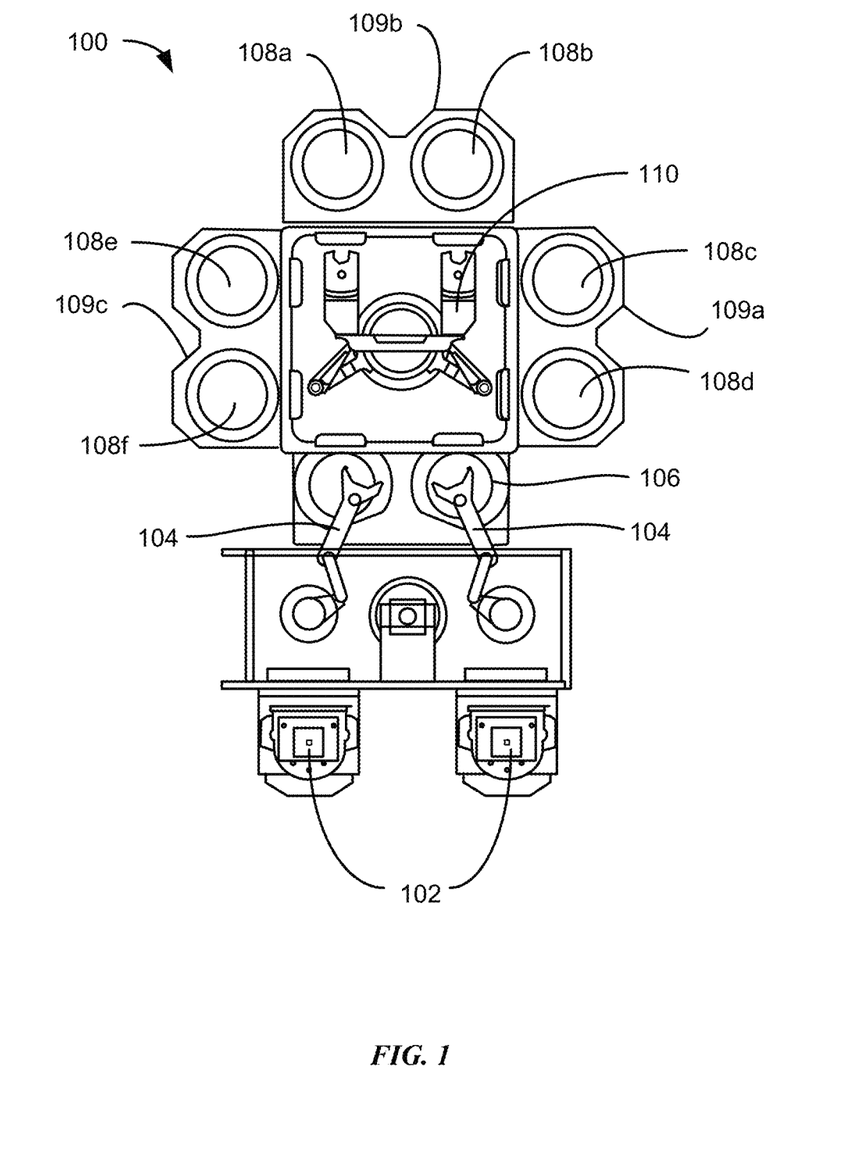
FIG. 1 shows a top plan view of an exemplary processing system according to embodiments of the present technology.

FIG. 1 shows a top plan view of one embodiment of a processing system 100 of deposition, etching, baking, and curing chambers according to embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching any number of metal or dielectric materials on the substrate wafer. In one configuration, two pairs of the processing chambers, e.g., 108c-d and 108e-f, may be used to deposit material on the substrate, and the third pair of processing chambers, e.g., 108a-b, may be used to etch the deposited materials. In another configuration, all three pairs of chambers, e.g., 108a-f, may be configured to etch a material layer on the substrate. Any one or more of the processes described may be carried out in one or more chamber separated from the fabrication system shown in different embodiments. It will be appreciated that additional configurations of deposition, etching, annealing, and curing chambers for dielectric films are contemplated by system 100. Any number of the structures or layers described throughout the present disclosure may be formed in one or more chambers incorporated with a system like system 100, or any other processing system in which semiconductor fabrication may be performed.

Figure 2:
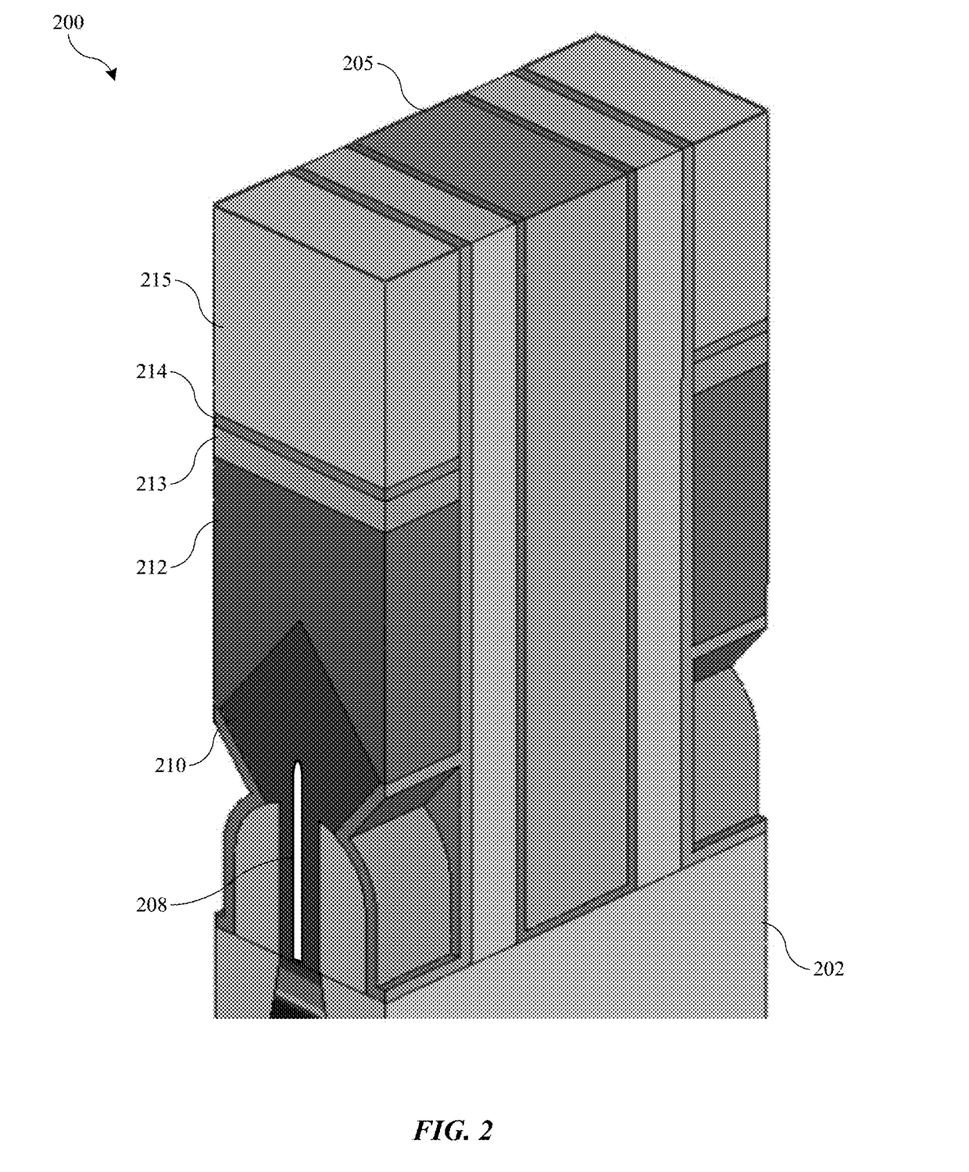
FIG. 2 shows a schematic isometric view of a semiconductor structure according to some embodiments of the present technology.

FIG. 2 illustrates a semiconductor structure 200 according to some embodiments of the present technology. The structure may illustrate aspects of a FinFET structure that incorporates a through-contact material extending between a source/drain structure and a contact or plug metal. It is to be understood that FIG. 2 illustrates only a partial schematic view, and a substrate may contain any number of transistor sections having aspects as illustrated in the figure. The structure may illustrate a gate structure, such as along a P or N region of the substrate. As illustrated, structure 200 may include a substrate 202 made of or containing silicon or some other semiconductor substrate material, and on which one or more fins may have been formed across the substrate 202. Structure 200 may also include any number of transistor structures formed overlying the substrate 202. For example, a gate structure 205 may be formed over the substrate, and which may be a conductive or metal material. As illustrated, the gate structure 205 may be formed overlying the substrate in a first direction across the substrate. Additionally, fins 208 may be formed in a second direction, and the fins 208 may specifically intersect and cross through the gate structures 205.

The transistor structures may include a source/drain region 210 of the substrate which may extend about the fin. As described above, structure 200 may illustrate an N or P region of the substrate, which may be or use similar or different materials in embodiments for various aspects of the structure. For example, source/drain material 210 may include an n-contact material for an N-MOS operating region, which may be a silicon-containing material, such as, for example, silicon phosphide (SiP), or may be any other material that may operate in an n-region of the substrate. Similarly, source/drain material 210 may include a p-contact material for a P-MOS operating region, which may be a silicon-containing material, such as, for example, silicon germanium (SiGe), or may be any other material that may operate in a p-region of the substrate. The transistor structure may include any number of designs currently used in semiconductors, being developed, or future designs that may utilize aspects of the present technology described further below. The source/drain material 210 may take any number of forms, and may include a sawtooth external profile, a triangular external profile, or a diamond external profile, among many other variations that would be understood to be encompassed by the present technology. The profile may also include multiple sections of source/drain material 210. On exterior surfaces, the source/drain material 210 may be characterized by sloped sidewalls as shown in the figure, although any alternative structure may similarly be encompassed by the present technology.

The structure may include gate 205 as noted above, and formed over the substrate 202. Gate 205 may include a metal, such as tungsten, cobalt, or any other suitable metal or material for a gate function, and may include a dummy material, such as silicon, depending on the stage of fabrication when the structure has been formed. Gate 205 may be contained within spacers, which may be or include a low-k spacer including a variety of dielectric materials. An exemplary material may be silicon nitride in embodiments. Additional spacer layers may be used as illustrated, and which may include a variety of materials such as silicon oxide, silicon nitride, silicon oxycarbide, silicon oxynitride, silicon carbonitride, silicon oxycarbonitride, or which may be a metal-containing material including any of the oxygen, nitrogen, and/or carbon concentrations, and may include, for example, aluminum, magnesium, titanium, tantalum, or any other metal and transition metal species, as well as other metalloid materials.

Contact metal material 215 may extend adjacent the gate or spacer materials and may contact, or be electrically coupled with, source/drain material 210. Between the source/drain material 210 and the metal material 215, may be one or more additional layers of materials according to some embodiments according to the present technology. For example, a through-contact material 212 may be included overlying the source/drain material, and may at least partially extend about source/drain material 205 as illustrated, a silicide material 213 may be included overlying the through-contact material 212, and a liner 214 or barrier layer may be included overlying the silicide material 213. Metal material 215 may extend to the liner material 214, and may be in contact with the liner, or other layer if one or more of the materials are not included. The metal material 215 may be any number of metals including tungsten, cobalt, or other metals suitable for semiconductor structures.

As illustrated in FIG. 2, a first surface of the through-contact material 212 may extend at least partially along the source/drain material 210. For example, when source/drain material 210 is characterized by sloped sidewalls as illustrated, which may extend to a diamond or top point, through-contact material 212 may extend from the point down the sloped sidewalls, such as towards substrate 202. As illustrated, a second surface of through-contact material 212 opposite the first surface may be in contact with silicide material 213. As shown in the figure, this second surface of through-contact material 212, silicide material 213, liner material 214, and metal material 215, which may be a contact plug, may all be characterized by a planar surface as illustrated. The silicide material 213 may be or include a metal silicide, and although termed silicide, may also encompass metal germanides and metal silicon germanides. Liner 214 may be or include a metal oxide, or metal nitride, as well as any of the previously described materials.

As described previously, when device structures shrink in size, the contact resistance in the contact regions may increase between particular materials. For example, the metal material may be characterized by a resistivity less than or about 500 $\mu\Omega$-cm, less than or about 250 $\mu\Omega$-cm, less than or about 100 $\mu\Omega$-cm, less than or about 50 $\mu\Omega$-cm, less than or about 40 $\mu\Omega$-cm, less than or about 30 $\mu\Omega$-cm, less than or about 20 $\mu\Omega$-cm, or less, as may the silicide material 213. The metal material or silicide material may also be characterized by a resistivity less than or about 20 $\mu\Omega$-cm, less than or about 10 $\mu\Omega$-cm, less than or about 5 $\mu\Omega$-cm, less than or about 1 $\mu\Omega$-cm, less than or about 0.1 $\mu\Omega$-cm, or less. Because the silicide material may be characterized by a thickness of less than or about 5 nm, the resistivity may be minimized. In some embodiments the silicide may be characterized by a thickness of less than or about 50 nm, less than or about 30 nm, less than or about 10 nm, less than or about 5 nm, less than or about 1 nm, less than or about 0.1 nm, or less. Liner material 214 may be similar to a barrier, and may be characterized by a resistivity of less than or about 1000 $\mu\Omega$-cm, less than or about 800 $\mu\Omega$-cm, less than or about 600 $\mu\Omega$-cm, less than or about 500 $\mu\Omega$-cm, less than or about 400 $\mu\Omega$-cm, less than or about 300 $\mu\Omega$-cm, less than or about 200 $\mu\Omega$-cm, or less. The liner material may be characterized by a resistivity of less than or about 100 $\mu\Omega$-cm, less than or about 50 $\mu\Omega$-cm, less than or about 20 $\mu\Omega$-cm, less than or about 10 $\mu\Omega$-cm, less than or about 5 $\mu\Omega$-cm, less than or about 1 $\mu\Omega$-cm, less than or about 0.1 $\mu\Omega$-cm, or less.

A contact resistivity may exist between the through-contact material 212 and the silicide material 213. The contact resistance through this structure may be a function of the contact resistivity and the contact area. The present technology may control both aspects of the contact resistivity and the contact area at this location to reduce the plug resistance through the structure. For example, the source/drain material 210 and the through-contact material 212 may each be a silicon-containing material, such as any material previously described. By doping the silicon material to a higher amount, the resistivity of the material may be reduced. For example, in some embodiments the source/drain material 210 and/or the through-contact material 212 may be heavily doped with one or more materials including boron, arsenic, phosphorus, antimony, or other materials. The further the extent of doping, the lower the resistivity of the material may be.

For example, in some embodiments, and depending on the materials and dopant, the doping may be greater than or about a solubility of $1 \times 10^{19}$ atoms/cm$^3$, and may be greater than or about $1 \times 10^{20}$ atoms/cm$^3$, greater than or about $2 \times 10^{20}$ atoms/cm$^3$, greater than or about $4 \times 10^{20}$ atoms/cm$^3$, greater than or about $5 \times 10^{20}$ atoms/cm$^3$, greater than or about $7 \times 10^{20}$ atoms/cm$^3$, greater than or about $1 \times 10^{21}$ atoms/cm$^3$, greater than or about $1.5 \times 10^{21}$ atoms/cm$^3$, greater than or about $2 \times 10^{21}$ atoms/cm$^3$, greater than or about $3 \times 10^{21}$ atoms/cm$^3$, greater than or about $4 \times 10^{21}$ atoms/cm$^3$, greater than or about $5 \times 10^{21}$ atoms/cm$^3$, or higher. This amount of doping may reduce the resistivity of the source/drain material and/or the through-contact material 212 to less than or about 100.0 mΩ-cm, and may reduce the resistivity to less than or about 80.0 mΩ-cm, less than or about 60.0 mΩ-cm, less than or about 40.0 mΩ-cm, less than or about 20.0 mΩ-cm, less than or about 10.0 mΩ-cm, less than or about 5.0 mΩ-cm, less than or about 1.0 mΩ-cm, less than or about 0.9 mΩ-cm, less than or about 0.8 mΩ-cm, less than or about 0.7 mΩ-cm, less than or about 0.6 mΩ-cm, less than or about 0.5 mΩ-cm, less than or about 0.4 mΩ-cm, less than or about 0.3 mΩ-cm, less than or about 0.2 mΩ-cm, less than or about 0.1 mΩ-cm, less than or about 80.0 μΩ-cm, less than or about 60.0 μΩ-cm, less than or about 40.0 μΩ-cm, less than or about 20.0 μΩ-cm, less than or about 10.0 μΩ-cm, less than or about 5.0 μΩ-cm, less than or about 1.0 μΩ-cm, or less.

This may reduce the contact resistivity at the interface of the through-contact material 212 and the silicide material 213 to be less than or about 10 nΩ-cm$^2$, and may reduce the contact resistivity at the interface to be less than or about 8 nΩ-cm$^2$, less than or about 6 nΩ-cm$^2$, less than or about 4 nΩ-cm$^2$, less than or about 2 nΩ-cm$^2$, less than or about 1 nΩ-cm$^2$, less than or about 0.1 nΩ-cm$^2$, less than or about 0.01 nΩ-cm$^2$, or less. Consequently, the contact plug resistance may be less than or about 50,000Ω in some embodiments based on the structure sizes and contact resistivities, and may be less than or about 1,000Ω, less than or about 900Ω, less than or about 800Ω, less than or about 700Ω, less than or about 600Ω, less than or about 500Ω, less than or about 400Ω, less than or about 300Ω, less than or about 200Ω, less than or about 100Ω, less than or about 50Ω, less than or about 10Ω, or less. However, as noted previously, the contact resistance may also be a function of the contact area between the materials. FIG. 2 illustrates a first example of a structure characterized by a planar interface between the metal material and the through-contact material as described above. By modifying the profiles of the materials further, the contact area may be increased, which may further reduce the contact resistance of the structure in some embodiments.

Figure 3A:
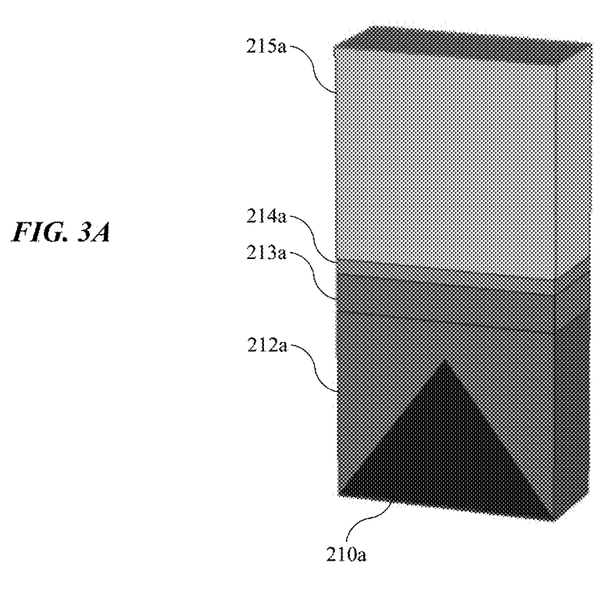
FIGS. 3A-3D show schematic isometric views of semiconductor structures according to some embodiments of the present technology.

Turning to FIGS. 3A-3D are shown schematic isometric views of semiconductor structures according to some embodiments of the present technology. The figures may show aspects of a contact plug overlying a source/drain material, such as described above with structure 200. It is to be understood that the figures show variations of structures or aspects of structures that may be combined with or incorporated with structure 200 or any number of other semiconductor structures encompassed by the present technology. For example, FIG. 3A illustrates the contact structure of semiconductor structure 200 described above. As illustrated, a portion of source/drain material 210a is shown, which may include sloped sidewalls as illustrated, and extending towards metal material 215a. Between these two structures may be a through-contact material 212a, a silicide material 213a, and a liner 214a.

As illustrated, and described above, a second surface of through-contact material 212a may be characterized by a substantially planar profile, which may be a plane orthogonal to gate material extending towards the substrate, for example, such as a plane substantially parallel with an underlying substrate. When used throughout this disclosure, substantially is meant to encompass less than a perfectly planar material, or whatever characteristics may be described. For example, an amount of surface roughness or slope may prevent a perfectly planar surface, but it would be readily understood by the skilled artisan that these structures are similarly encompassed by the present technology. It is also to be understood that each structure illustrated in the figures is or may be characterized by a similar distance from a tip of the source/drain material to the second surface of the through-contact material, such as 5 nm in one non-limiting example, although the distances may differ between one another and in some embodiments. Additionally, the silicide may be characterized by a similar thickness throughout, such as 5 nm in one non-limiting example, and the liner may also be characterized by a similar thickness throughout, such as 2 nm in one non-limiting example, which may afford some of the comparative information discussed. This may afford a comparison to contact resistance based on contact area differences between the structures. However, it is to be understood that any of the structures or materials within the structures may be characterized by any range of thicknesses. Each of the following structures may be characterized by a non-planar profile along the second surface, which may increase the contact area compared to the structure of FIG. 3A.

Figure 3B:
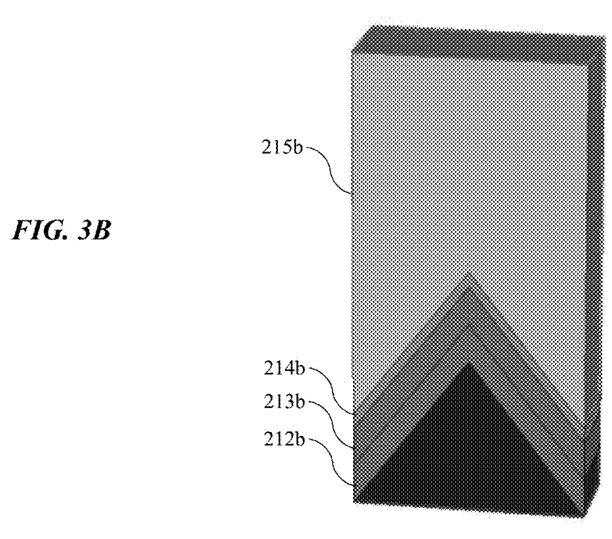

FIG. 3B illustrates a variation on the structure in which the through-contact material may be characterized by a similar profile on the second surface as the first. For example, as illustrated, each of through-contact material 212b, silicide material 213b, and liner 214b may be characterized by a similar exterior profile, which may include substantially parallel sloping along a portion of the second surface with a corresponding portion of the first surface, or an exterior surface of the source/drain material. It is to be understood that the illustrated profile is merely exemplary, and alternative angles of slope are similarly encompassed by the present technology. For example, the materials may all be characterized by a greater or lesser angle of slope relative to the source/drain material. Based on the angle of slope, the structure illustrated in FIG. 3B may be characterized by a greater surface area contact between the through-contact material and the silicide material.

For example, and again based on the angle of slope, the contact area between the layers may be at least about 1.1 times the contact area of the structure in FIG. 3A, and may be at least about 1.2 times the contact area, at least about 1.3 times the contact area, at least about 1.4 times the contact area, at least about 1.5 times the contact area, at least about 1.6 times the contact area, at least about 1.7 times the contact area, at least about 1.8 times the contact area, at least about 2.0 times the contact area, at least about 3.0 times the contact area, at least about 4.0 times the contact area, or more. This increase in contact area may reduce the contact resistance by greater than or about 20%, greater than or about 30%, greater than or about 40%, greater than or about 50%, greater than or about 60%, greater than or about 70%, greater than or about 80%, greater than or about 90%, greater than or about 100%, or more. The structure of FIG. 3B also includes less through-contact material relative to FIG. 3A as well as relative to structures that may not include through-contact material, and thus the decreased material may also reduce the resistance contribution of that material relative to the additional metal included.

Figure 3C:
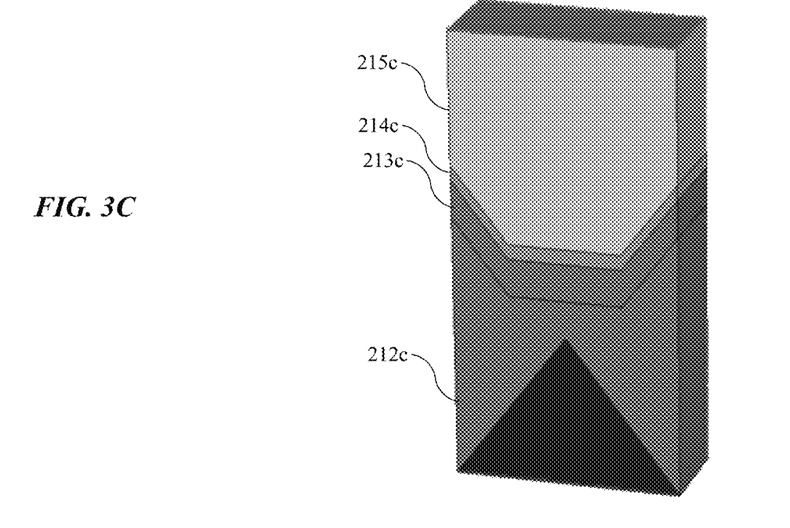

FIG. 3C shows an additional variation that may include a partially planar surface, and a partially sloped surface between the layers. As illustrated, a first surface of through-contact material 212c may comply with the slope of the source/drain material, a second surface may be characterized by an additional shape, which may be accommodated by silicide material 213c, liner 214c, and metal material 215c. Although the surfaces at the edges slope away from the source/drain material, in other embodiments the surface may slope towards or away from the source/drain material at any of a variety of angles. The structure illustrated may provide a contact area between the structures of FIG. 3A and FIG. 3B, and, depending on the extent and angle of slope, the contact area between the through-contact material and silicide material layers may be at least about 1.2 times the contact area of the planar structure, and may be at least about 1.3 times the contact area, at least about 1.4 times the contact area, or more. This increase in contact area may reduce the contact resistance by greater than or about 5%, greater than or about 10%, greater than or about 15%, greater than or about 20%, or more, relative to the planar structure.

Figure 3D:
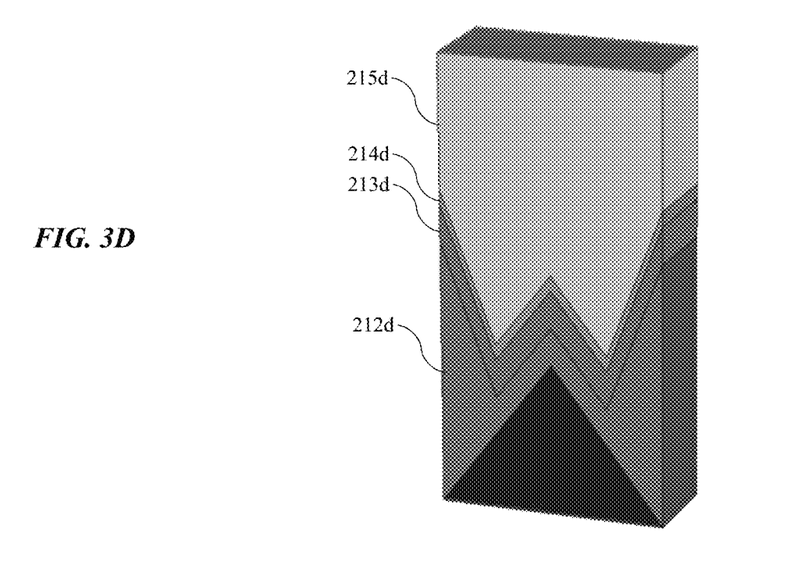

FIG. 3D shows an additional variation that may include multiple sloped surfaces, including interior and exterior sloping. Again, although the surfaces at the edges slope away from the source/drain material, in other embodiments the surface may slope towards the source/drain material, or at any number of different angles relative to what is shown. As illustrated, a portion of the through-contact material 212d may conform to the sloped sidewalls of the source/drain material, while an additional portion, such as outward from the center, may slope in an opposite direction. Again, this structure may be accommodated by silicide material 213d, liner material 214d, and metal material 215d. The structure illustrated may provide a contact area greater than the other illustrated structures, and, depending on the extent and angle of slope, the contact area between the through-contact material and silicide material layers may be at least about 2 times the contact area of the planar structure, and may be at least about 2.1 times the contact area, at least about 2.2 times the contact area, at least about 2.4 times the contact area, or more. The through-contact material may cover a slightly greater volume than in FIG. 3B, which may increase the material resistivity slightly, although the gains in surface area may compensate for the increase. Consequently, the increase in contact area may reduce the contact resistance by greater than or about 20%, greater than or about 30%, greater than or about 40%, greater than or about 50%, or more, relative to the planar structure.

Depending on the resistivity of the through-contact material, the increase in contact area may overcome the loss from increased through-contact material. For example, whereas the structures of FIG. 3D and FIG. 3B may be characterized by a relatively similar contact resistance when the through-contact material is characterized by a resistivity of about 0.5 mΩ-cm, the structure of FIG. 3D may be characterized by lower contact resistance when the through-contact material is characterized by a resistivity of about 0.1 mΩ-cm. For example, the structure of FIG. 3D may be characterized by at least about 5% lower contact resistance, and may be characterized by at least about 10% lower contact resistance or more. It is to be understood that the examples of FIGS. 3A-3D are merely illustrative of structures encompassed by the present technology, which may increase surface area over a planar interface with any of a variety of non-planar interfaces. Additional structural adjustments may also be performed.

Figure 4:
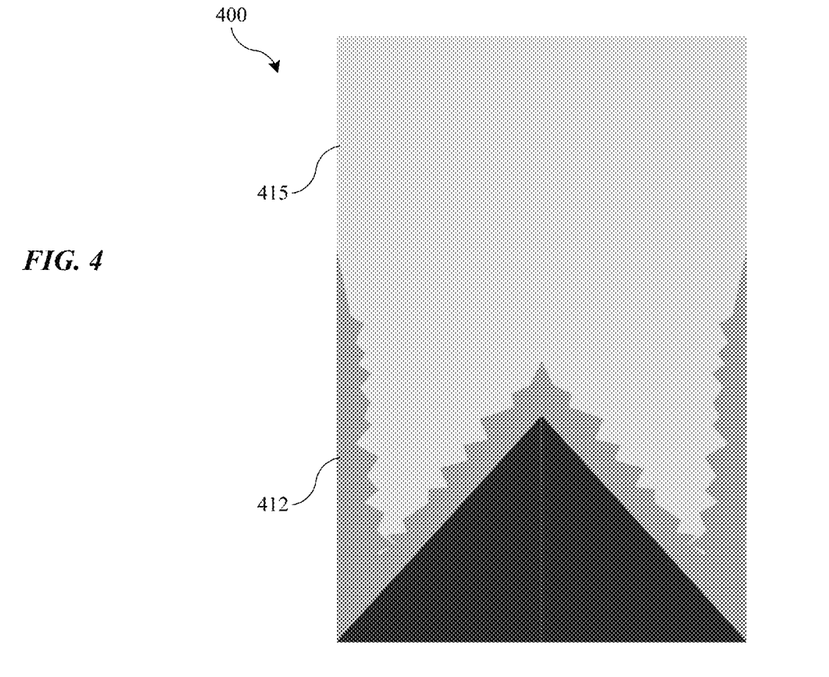
FIG. 4 shows a schematic view of a semiconductor structure according to some embodiments of the present technology.

FIG. 4 shows a schematic view of a semiconductor structure 400 according to some embodiments of the present technology. Structure 400 may illustrate a contact plug structure similar to FIG. 3D, and may include any of the materials or characteristics of that structure, and any previous structure may similarly include aspects of structure 400. For example, as illustrated, structure 400 may include a through-contact material 412 characterized by an uneven profile along a second surface facing metal material 415. This may increase the contact area by over ten times relative to a planar structure described above, which may reduce the contact resistance by greater than or about 30%, and may reduce the contact resistance by greater than or about 40%, greater than or about 50%, greater than or about 60%, greater than or about 70%, greater than or about 80%, or more.

Although a silicide and liner material are not shown, they may be incorporated as previously described. The incorporation may also facilitate coverage across the jagged, or irregular, or denticulate structure. For example, formation of the silicide material may be substantially conformal, and may be similarly characterized by the profile of the second surface of the through-contact material. Formation of the liner, however, may be performed to accommodate the uneven structure of the silicide, while then forming a substantially even surface on an opposite surface on which the metal material may be formed. This may facilitate improved interface coverage of the metal, and may limit void formation.

Figure 5:
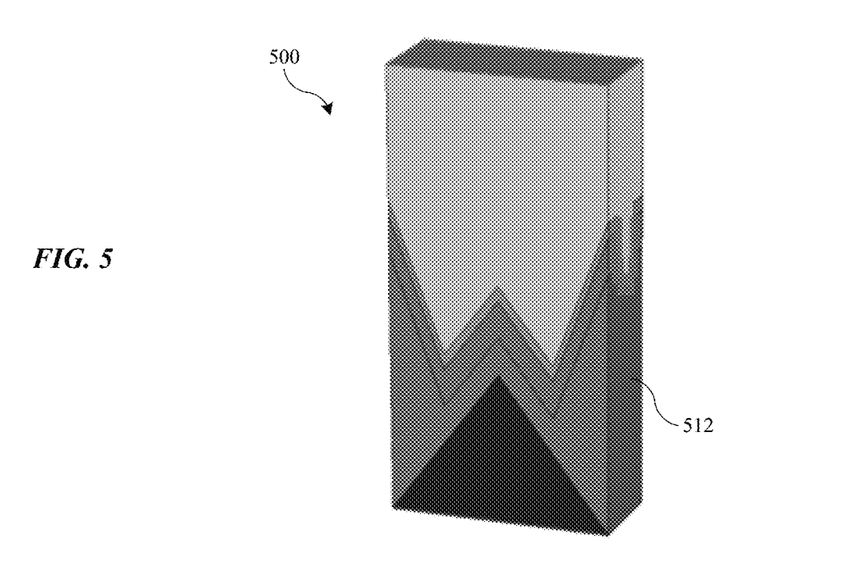
FIG. 5 shows a schematic isometric view of a semiconductor structure according to some embodiments of the present technology.

FIG. 5 shows a schematic isometric view of a semiconductor structure 500 according to some embodiments of the present technology. Structure 500 may illustrate a contact plug structure similar to FIG. 3D, and may include any of the materials or characteristics of that structure or any other structure encompassed by the present technology, and any previous structure may similarly include aspects of structure 500. For example, as illustrated, structure 500 may include a through-contact material 512 characterized by a first sloping profile in a direction orthogonal to the fin, such as illustrated in FIG. 3D. Because the contact plug may be a three-dimensional form, through-contact material 512 as illustrated may also be characterized by a second sloping profile in a direction parallel to the fin, such as orthogonal to a gate structure.

Any profile illustrated or otherwise encompassed by the present technology may be included in either direction, and the two profiles may be the same or different in some embodiments. This may increase the contact area by greater than or about 20% more than including a single profile, and may increase the contact area by greater than or about 30%, greater than or about 50%, greater than or about 80%, greater than or about 100%, or more, such as if either or both profiles may include the uneven profile illustrated above with structure 400. By incorporating profile adjustments and/or highly doped materials, the present technology may provide reduced contact resistance structures that may improve device performance, and may facilitate metal fill by reducing the aspect ratio based on incorporation of the through-contact material.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure, the semiconductor structure comprising:
   a substrate;
   a gate structure overlying the substrate and formed in a first direction across the substrate;
   a fin overlying the substrate and formed in a second direction across the substrate, wherein the second direction is orthogonal to the first direction, and wherein the fin intersects the gate structure;
   a source/drain material formed about the fin;
   a through-contact material overlying and at least partially extending about the source/drain material;
   a metal material extending vertically above the through-contact material, wherein an interface between the metal material and the through-contact material is characterized by a non-planar profile;
   a silicide material overlying the through-contact material, wherein the metal material is overlying the silicide material; and
   a liner material extending between the silicide and the metal material.

2. The semiconductor structure of claim 1, wherein the silicide material is in contact with the through-contact material.

3. The semiconductor structure of claim 1, wherein the liner material is in contact with the metal material.

4. The semiconductor structure of claim 1, wherein a contact area of a surface of the through-contact material facing the metal material is characterized by a surface area greater than a corresponding surface area of a planar interface.

5. The semiconductor structure of claim 1, wherein the through-contact material is at least partially characterized by a first sloping profile in a direction orthogonal to the fin.

6. The semiconductor structure of claim 5, wherein the through-contact material is at least partially characterized by a second sloping profile in a direction parallel to the fin.

7. The semiconductor structure of claim 1, wherein the through-contact material conformally extends across the source/drain material along a first surface of the through-contact material, and wherein a second surface of the through-contact material opposite the first surface is characterized by an uneven surface profile.

8. The semiconductor structure of claim 1, wherein the source/drain material comprises a dopant incorporated within silicon, and wherein the dopant comprises phosphorus or arsenic.

9. The semiconductor structure of claim 8, wherein the source/drain material is characterized by a resistance less than or about 50.0 mΩ-cm.

10. The semiconductor structure of claim 8, wherein the through-contact material comprises a doped silicon.

11. A semiconductor structure, the semiconductor structure comprising:
    a substrate;
    a gate structure overlying the substrate and formed in a first direction across the substrate;
    a fin overlying the substrate and formed in a second direction across the substrate, wherein the second direction is orthogonal to the first direction, and wherein the fin intersects the gate structure;
    a source/drain material formed about the fin, the source/drain material characterized by sloped sidewalls extending to a point;
    a through-contact material overlying the source/drain material;
    a silicide material overlying the through-contact material;
    a liner material overlying the silicide material; and
    a contact metal overlying the liner material, wherein an interface between the metal material and the through-contact material is characterized by a non-planar profile.

12. The semiconductor structure of claim 11, wherein the silicide material is in contact with the through-contact material.

13. The semiconductor structure of claim 11, wherein the liner material is in contact with the metal material.

14. The semiconductor structure of claim 11, wherein a first surface of the through-contact material is in contact with the source/drain material, and extends conformally along the sloped sidewalls.

15. The semiconductor structure of claim 14, wherein a second surface of the through-contact material opposite the first surface is at least partially characterized by sloped sidewalls substantially parallel with the sloped sidewalls of the source/drain material.

16. The semiconductor structure of claim 11, wherein the source/drain material comprises a dopant incorporated within silicon, and wherein the dopant comprises phosphorus or arsenic.

17. The semiconductor structure of claim 16, wherein the source/drain material is characterized by a resistance less than or about 50.0 mΩ-cm.

18. The semiconductor structure of claim 11, wherein the through-contact material comprises a doped silicon.

19. A semiconductor structure, the semiconductor structure comprising:
- a substrate;
- a gate structure overlying the substrate and formed in a first direction across the substrate;
- a fin overlying the substrate and formed in a second direction across the substrate, wherein the second direction is orthogonal to the first direction, and wherein the fin intersects the gate structure;
- a source/drain material formed about the fin, the source/drain material characterized by sloped sidewalls extending to a point;
- a metal material extending vertically above the source/drain material;
- a through-contact material extending between the source/drain material and the metal material, wherein a first surface of the through-contact material extends along the sloped sidewalls of the source/drain material, wherein an interface between the metal material and the through-contact material is characterized by a non-planar profile;
- a silicide material extending in contact with a second surface of the through-contact material opposite the first surface; and
- a liner extending between the silicide material and the metal material.

20. The semiconductor structure of claim 19, wherein the source/drain material is characterized by a resistance less than or about 50.0 mΩ-cm.

\* \* \* \* \*